US012563795B2

(12) United States Patent
Fukui et al.

(10) Patent No.: US 12,563,795 B2
(45) Date of Patent: Feb. 24, 2026

(54) MULTILAYER STRUCTURE

(71) Applicant: NGK Insulators, Ltd., Nagoya (JP)

(72) Inventors: Hiroshi Fukui, Obu (JP); Morimichi Watanabe, Nagoya (JP); Jun Yoshikawa, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 545 days.

(21) Appl. No.: 18/181,636

(22) Filed: Mar. 10, 2023

(65) Prior Publication Data

US 2023/0231013 A1 Jul. 20, 2023

Related U.S. Application Data

(63) Continuation of application No. PCT/JP2021/021939, filed on Jun. 9, 2021.

(30) Foreign Application Priority Data

Sep. 24, 2020 (JP) ................................. 2020-159611

(51) Int. Cl.
*H10D 62/80* (2025.01)
*C30B 29/16* (2006.01)
(Continued)

(52) U.S. Cl.
CPC ........... *H10D 62/117* (2025.01); *C30B 29/16* (2013.01); *C30B 29/68* (2013.01);
(Continued)

(58) Field of Classification Search
None
See application file for complete search history.

(56) References Cited

U.S. PATENT DOCUMENTS

2015/0380500 A1 12/2015 Masui et al.
2017/0200790 A1 7/2017 Hitora et al.
(Continued)

FOREIGN PATENT DOCUMENTS

JP 2016-013932 A 1/2016
JP 2016-157878 A 9/2016
(Continued)

OTHER PUBLICATIONS

Masaya Oda, 'Crack-free thick (~5 μm) a-Ga2O3 films on sapphire substrates with α-(Al, Ga)2O3 buffer layers,' 2016 Jpn. J. Appl. Phys. 55 1202B4 (Year: 2016).*
(Continued)

*Primary Examiner* — Bryan R Junge
(74) *Attorney, Agent, or Firm* — BURR PATENT LAW, PLLC

(57) ABSTRACT

A multilayer structure of the present invention is a multilayer structure including a base substrate and a semiconductor film that is made of $\alpha$-$Ga_2O_3$ or an $\alpha$-$Ga_2O_3$-based solid solution and has a corundum crystal structure, the semiconductor film being disposed on the base substrate. The semiconductor film has an average film thickness of greater than or equal to 10 μm. The semiconductor film is convexly or concavely warped. An amount of warpage of the semiconductor film is 20 μm or greater and 64 μm or less.

5 Claims, 7 Drawing Sheets

(51) Int. Cl.

| | |
|---|---|
| *C30B 29/68* | (2006.01) |
| *H01L 21/02* | (2006.01) |
| *H10D 62/10* | (2025.01) |
| *C30B 25/14* | (2006.01) |
| *H10D 62/40* | (2025.01) |

(52) U.S. Cl.
CPC ..... *H01L 21/02565* (2013.01); *H10D 62/875* (2025.01); *C30B 25/14* (2013.01); *H01L 21/0242* (2013.01); *H01L 21/0262* (2013.01); *H10D 62/40* (2025.01); *H10D 62/80* (2025.01)

(56) References Cited

U.S. PATENT DOCUMENTS

| | | |
|---|---|---|
| 2021/0408242 A1 | 12/2021 | Watanabe et al. |
| 2023/0245883 A1* | 8/2023 | Hashigami ............ C30B 25/183 |
| | | 257/76 |

FOREIGN PATENT DOCUMENTS

| | | |
|---|---|---|
| JP | 2017-214232 A | 12/2017 |
| JP | 2019-033271 A | 2/2019 |
| WO | 2020/194763 A1 | 10/2020 |

OTHER PUBLICATIONS

"*HVPE Growth of β- and ε-Ga2O3 on Patterned Sapphire Substrates,*" V I Nikolaev et al., Journal of Physics: Conference Series, vol. 1400, pp. 1-7.

Chinese Office Action dated Oct. 17, 2024 (Application No. 202180054549.7).

International Search Report and Written Opinion (Application No. PCT/JP2021/021939) dated Jul. 27, 2021.

English translation of the International Preliminary Report on Patentability (Chapter I) dated Apr. 6, 2023 (Application No. PCT/JP2021/021939).

* cited by examiner

MULTILAYER STRUCTURE

BACKGROUND OF THE INVENTION

1. Field of the Invention

The present invention relates to a multilayer structure.

2. Description of the Related Art

In recent years, gallium oxide ($Ga_2O_3$) has attracted attention as a semiconductor material. Gallium oxide is known to have five crystal forms of $\alpha$, $\beta$, $\gamma$, $\delta$, and c, among which $\alpha$-$Ga_2O_3$ has a very large band gap of 5.3 eV and is expected as a power semiconductor material. Because $\alpha$-$Ga_2O_3$ is a metastable phase, however, $\alpha$-$Ga_2O_3$ has not been practically used as a single-crystal substrate and is generally formed on a sapphire substrate by heteroepitaxial growth.

For example, PTL 1 discloses an example in which an $\alpha$-$Ga_2O_3$ film, which serves as a crystalline oxide semiconductor film, is formed on a buffer layer formed on a c-plane sapphire substrate. The buffer layer includes an $\alpha$-$(Al_{0.02}Ga_{0.98})_2O_3$ layer and an $\alpha$-$Ga_2O_3$ layer that are alternately stacked. In this example, the crystalline oxide semiconductor film is one in which a content of rotation domains in the film is less than or equal to 0.02 vol %, and in addition, warpage is reduced. (Specifically, the shortest distance from a straight line to an apex of a convexly warped portion or a concavely warped portion is reduced to as little as 0.21 $\mu$m. The straight line is the shortest straight line connecting two endpoints that are 5 mm apart from each other.)

CITATION LIST

Patent Literature

PTL 1: Japanese Unexamined Patent Application Publication No. 2016-157878
PTL 2: Japanese Unexamined Patent Application Publication No. 2019-33271

SUMMARY OF THE INVENTION

Unfortunately, with the technique of PTL 1, it is difficult to produce an $\alpha$-$Ga_2O_3$-based semiconductor film that is substantially free of cracks over a large area, and, in particular, it is difficult to produce a semiconductor film having a sufficiently reduced number of cracks in instances in which the film is designed to have a large thickness of 10 $\mu$m or greater. Furthermore, in instances where a film produced with this technique is made to be free-standing by being removed from a film-forming base substrate, or in instances where the film made to be free-standing is transferred to a different supporting substrate, the $\alpha$-$Ga_2O_3$-based semiconductor film may experience cracking and/or a loss of portions due to a removal failure during or after the removal. Accordingly, there is a need to inhibit cracking and a removal failure from occurring during the manufacture of an $\alpha$-$Ga_2O_3$-based semiconductor film, thereby manufacturing the $\alpha$-$Ga_2O_3$-based semiconductor film in high yield.

Regarding removal methods, PTL 2, for example, discloses a method that performs removal by applying a mechanical impact, a method that performs removal by using a thermal stress by applying heat, a method that performs removal by applying vibrations, such as those of ultrasonic waves, and a method that performs removal by etching.

The present invention has been made to solve the problems described above, and a principal object of the present invention is to inhibit cracking and a removal failure from occurring during the manufacture of an $\alpha$-$Ga_2O_3$-based semiconductor film.

A multilayer structure of the present invention is a multilayer structure including a base substrate and a semiconductor film that is made of $\alpha$-$Ga_2O_3$ or an $\alpha$-$Ga_2O_3$-based solid solution and has a corundum crystal structure, the semiconductor film being disposed on the base substrate (hereinafter, this semiconductor film is referred to as an "$\alpha$-$Ga_2O_3$-based semiconductor film"). The semiconductor film has an average film thickness of greater than or equal to 10 $\mu$m. The semiconductor film is convexly or concavely warped. An amount of warpage of the semiconductor film is 20 $\mu$m or greater and 64 $\mu$m or less.

In this multilayer structure, the $\alpha$-$Ga_2O_3$-based semiconductor film is one in which the occurrence of cracking and a removal failure during the manufacture is inhibited. The mechanism for this is not clear and is assumed to be as follows: since the amount of warpage of the $\alpha$-$Ga_2O_3$-based semiconductor film is within the appropriate range, the semiconductor film is placed into a state in which a proper stress is applied thereto, and, consequently, the semiconductor film can be easily removed from the base substrate, and the possibility of cracking is reduced. If the amount of warpage is less than the lower limit of the appropriate range, the stress applied to the semiconductor film is insufficient, and as a result, it is possible that the semiconductor film can only be partially removed from the base substrate, or cracking may occur if a stronger force is applied to remove the semiconductor film. If the amount of warpage is greater than the upper limit of the appropriate range, the stress applied to the semiconductor film is excessively high, and as a result, cracking may occur in the semiconductor film on the base substrate.

In the present invention, a method for manufacturing a semiconductor film may include a step (a) and a step (b). In the step (a), a semiconductor film made of $\alpha$-$Ga_2O_3$ or an $\alpha$-$Ga_2O_3$-based solid solution and having a corundum crystal structure is formed on a base substrate by performing a mist-CVD method or an HVPE method at a temperature of 300° C. or greater and 800° C. or less, and subsequently, the temperature is reduced to room temperature; in this manner, the multilayer structure described above is produced. In the step (b), the semiconductor film of the multilayer structure is removed from the base substrate; in this manner, the semiconductor film is produced.

With the method for manufacturing a semiconductor film, the possibility of cracking and a removal failure during the manufacture of an $\alpha$-$Ga_2O_3$-based semiconductor film can be reduced, and, therefore, the $\alpha$-$Ga_2O_3$-based semiconductor film can be manufactured relatively easily with a high yield.

BRIEF DESCRIPTION OF THE DRAWINGS

FIGS. 1A and 1B are illustrations of a multilayer structure 10; FIG. 1A is plan view, and FIG. 1B is cross-sectional view taken along line A-A.

DETAILED DESCRIPTION OF THE INVENTION

[Multilayer Structure]

Figures 1A, 1B:
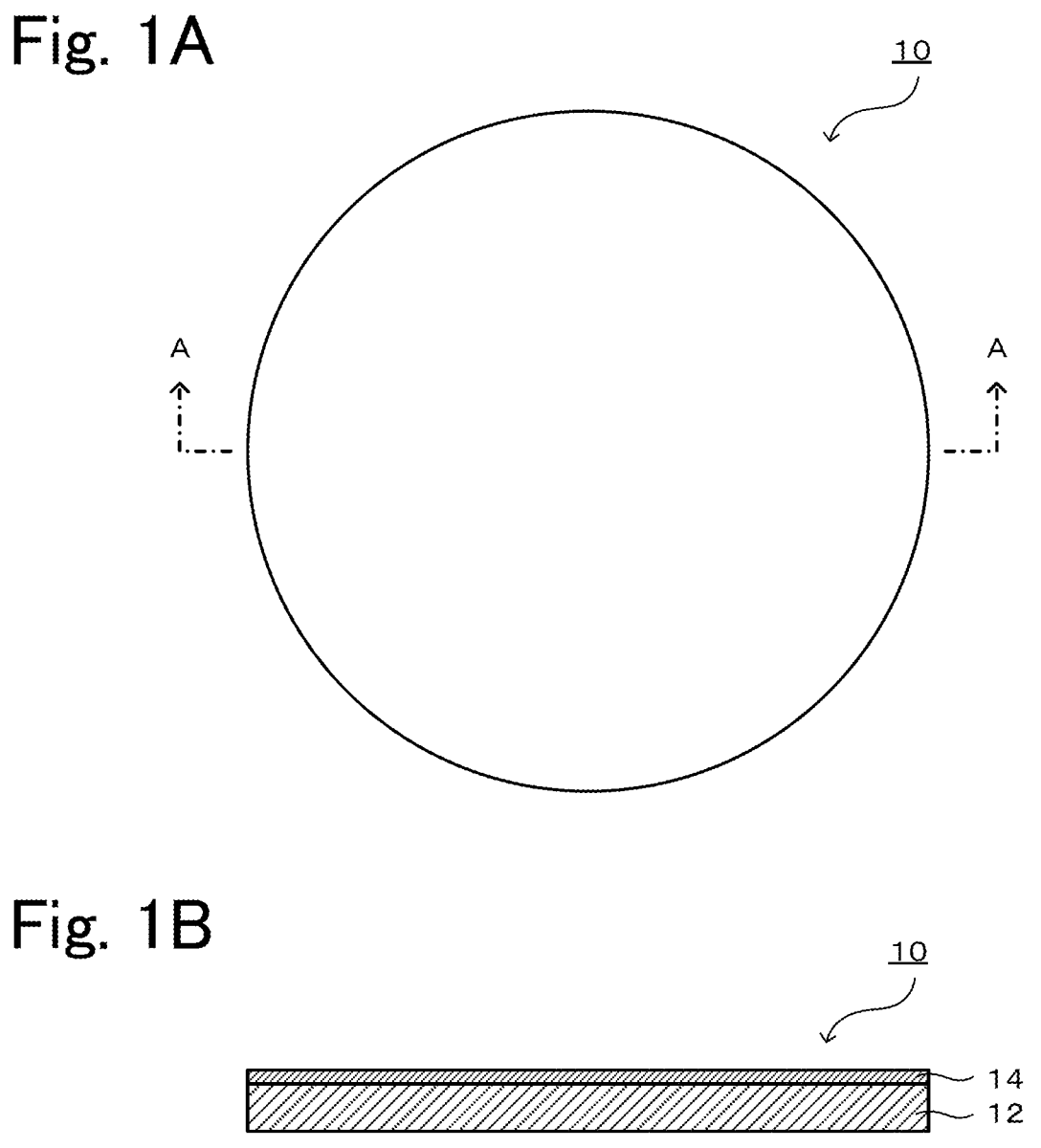
Figure 2:
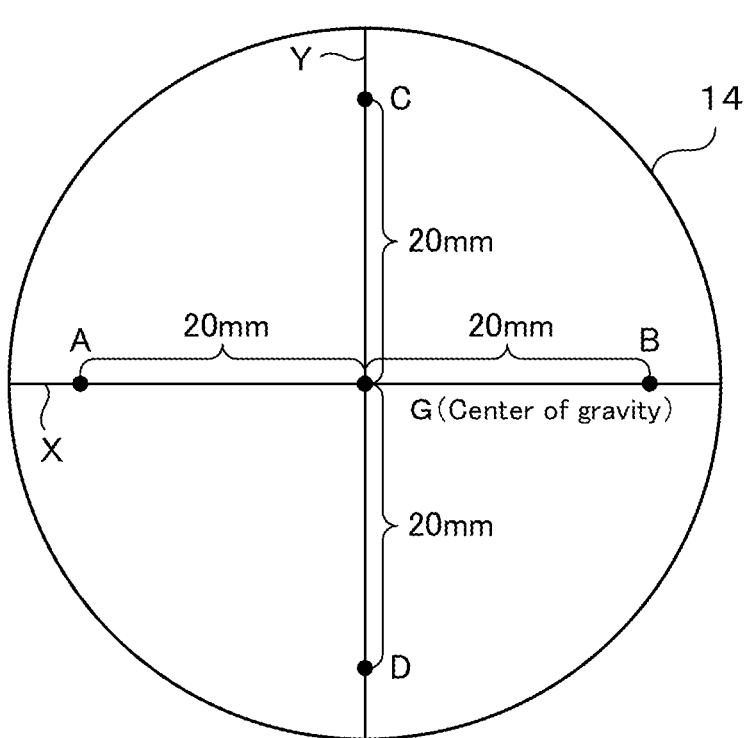
FIG. 2 is an illustration regarding a method for measuring an amount of warpage of a semiconductor film 14.

FIGS. 1A and 1B are illustrations of a multilayer structure 10, according to the present embodiment; FIG. 1A is a plan view, and FIG. 1B is a cross-sectional view taken along line A-A.

The multilayer structure 10 is a planar member and includes a semiconductor film 14 on a base substrate 12. In the present embodiment, the multilayer structure 10 is circular in a plan-view illustration thereof as viewed in plan. Note that the shape of the multilayer structure 10 in the plan-view illustration may not necessarily be circular and may be, for example, polygonal (e.g., quadrilateral, such as square or rectangular, pentagonal, hexagonal, or the like).

The base substrate 12 is preferably a substrate having a corundum structure and particularly preferably a substrate having orientations along two axes, namely the c-axis and the a-axis (biaxially textured substrate). The biaxially textured substrate may be a polycrystalline substrate or a mosaic crystalline substrate (a mosaic crystal is an assembly of crystals having slightly different crystal orientations) or may be a monocrystalline substrate. The base substrate 12 may be formed of a single material or a solid solution of multiple materials as long as the base substrate 12 has a corundum structure. The base substrate 12 may be a composite base substrate including a basic substrate and a layer disposed thereon. The basic substrate may be formed of a material having a corundum structure. The layer may be formed of a material having a lattice constant closer to that of $\alpha$-$Ga_2O_3$ than the material of the basic substrate has. For example, the composite base substrate can be manufactured as follows: (a) a basic substrate formed of a material having a corundum structure is provided; (b) a precursor of a textured layer is prepared with a material having a lattice constant closer to that of $\alpha$-$Ga_2O_3$ than the material of the base material has; (c) the precursor of a textured layer is heat-treated on the basic substrate to convert at least a portion thereof near the basic substrate into a textured layer; and (d) if desired, the textured layer is processed, for example, by grinding and/or polishing, to expose a surface of the textured layer. Examples of the base substrate 12 include sapphire substrates and composite base substrates including a sapphire substrate and a layer of an oxide (e.g., $\alpha$-$Cr_2O_3$ or $\alpha$-$Fe_2O_3$) disposed on a surface thereof, the layer having a lattice constant closer to that of $\alpha$-$Ga_2O_3$ than sapphire has.

The semiconductor film 14 is a film made of $\alpha$-$Ga_2O_3$ or an $\alpha$-$Ga_2O_3$-based solid solution and having a corundum crystal structure. That is, the semiconductor film 14 is an $\alpha$-$Ga_2O_3$-based semiconductor film. $\alpha$-$Ga_2O_3$ belongs to a trigonal symmetry group and has a corundum crystal structure. Furthermore, the $\alpha$-$Ga_2O_3$-based solid solution is a solid solution in which one or more other components are dissolved in $\alpha$-$Ga_2O_3$, with the corundum crystal structure being maintained. Examples of the other components include $Al_2O_3$, $In_2O_3$, $Cr_2O_3$, $Fe_2O_3$, $Rh_2O_3$, $V_2O_3$, and $Ti_2O_3$.

Figure 3:
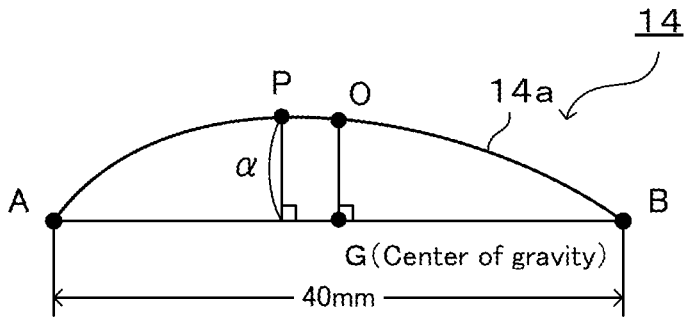
FIG. 3 is an illustration regarding the method for measuring the amount of warpage of the semiconductor film 14.
Figure 4:
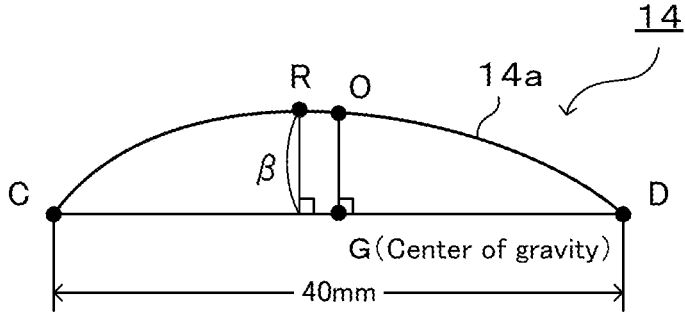
FIG. 4 is an illustration regarding the method for measuring the amount of warpage of the semiconductor film 14.
Figure 5:
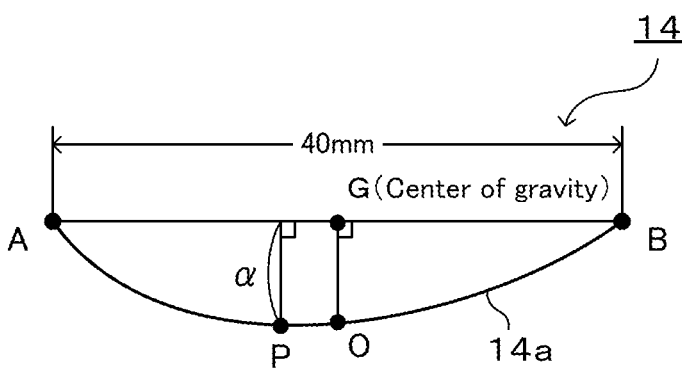
FIG. 5 is an illustration regarding the method for measuring the amount of warpage of the semiconductor film 14.
Figure 6:
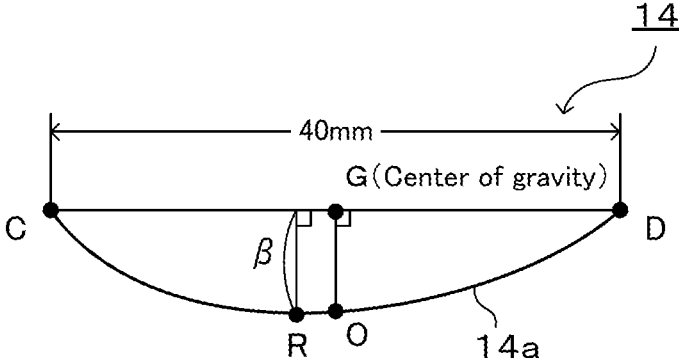
FIG. 6 is an illustration regarding the method for measuring the amount of warpage of the semiconductor film 14.

The semiconductor film 14 is convexly or concavely warped, and in either instance, an amount of warpage is within a range of 20 μm or greater and 64 μm or less, preferably 30 μm or greater and 64 μm or less, and more preferably 30 μm or greater and 50 μm or less. "The semiconductor film 14 is convexly warped" means that a film surface (a surface on a side opposite to a base substrate 12-side) of the semiconductor film 14 has a convexly warped shape as viewed in a cross section of the semiconductor film 14 taken along a thickness direction thereof, as illustrated in FIG. 3 and FIG. 4. "The semiconductor film 14 is concavely warped" means that the film surface (the surface on the side opposite to the base substrate 12-side) of the semiconductor film 14 has a concavely warped shape as viewed in a cross section of the semiconductor film 14 taken along a thickness direction thereof, as illustrated in FIG. 5 and FIG. 6.

The amount of warpage of the semiconductor film 14 will be described below with reference to FIG. 2 to FIG. 6. As illustrated in FIG. 2, in a plan-view illustration of the semiconductor film 14 as viewed in plan (circular, in this instance), a straight line X and a straight line Y are defined as two straight lines passing a point G and being orthogonal to each other, the point G being a center of gravity in the plan-view illustration; a point A and a point B are defined as two points each positioned on the straight line X and 20 mm away from the point G, and a point C and a point D are defined as two points each positioned on the straight line Y and 20 mm away from the point G. Next, as illustrated in FIG. 3 or FIG. 5, a point P is defined as a point from which a distance to a line segment AB is a maximum, among points on a curved line AB, which is a curved line extending on a surface 14a of the semiconductor film 14 from the point A to the point B. FIG. 3 illustrates an instance in which the semiconductor film 14 is convexly warped, and FIG. 5 illustrates an instance in which the semiconductor film 14 is concavely warped. An amount $\alpha$ of warpage is defined as the distance from the point P to the line segment AB. Furthermore, as illustrated in FIG. 4 or FIG. 6, a point R is defined as a point from which a distance to a line segment CD is a maximum, among points on a curved line CD, which is a curved line extending on the surface 14a of the semiconductor film 14 from the point C to the point D. FIG. 4 illustrates an instance in which the semiconductor film 14 is convexly warped, and FIG. 6 illustrates an instance in which the semiconductor film 14 is concavely warped. An amount $\beta$ of warpage is defined as the distance from the point R to the line segment CD. The amount $\alpha$ of warpage and the amount $\beta$ of warpage are designated as amounts defining the amount of warpage of the semiconductor film 14. The amount $\alpha$ of warpage and the amount $\beta$ of warpage are each within the range of 20 μm or greater and 64 μm or less. Furthermore, the value of the smaller of the amount $\alpha$ of warpage and the amount $\beta$ of warpage is preferably 50% or greater and 100% or less and more preferably 85% or greater and 100% or less of the value of the larger of the amount $\alpha$ of warpage and the amount $\beta$ of warpage.

The methods that may be used to measure the amount $\alpha$ of warpage and the amount $\beta$, of warpage are not particularly limited and include known methods. For example, the amount α of warpage and the amount β, of warpage can be measured with a high-precision laser measuring device (LT-9010M, manufactured by Keyence Corporation). Specifically, the amount α of warpage can be measured by measuring a distance extending from a point on the curved line AB to the line segment AB, for every 1 mm along the line segment AB, with a high-precision laser measuring device. The same applies to the amount β, of warpage.

Furthermore, as illustrated in FIG. 3 and FIG. 4, or FIG. 5 and FIG. 6, in an instance where a point O is defined as a point positioned on the surface 14a of the semiconductor film 14 and corresponding to the point G, it is preferable, from the standpoint of achieving removal of the Ga₂O₃-based semiconductor film without causing cracking, that a length of a line segment PO be less than or equal to 10 mm, and a length of a line segment RO be less than or equal to 10 mm. More preferably, these lengths are each less than or equal to 5 mm, and even more preferably, less than or equal to 3 mm. In particular, when the lengths are less than or equal to 5 mm, a warped shape of the Ga₂O₃-based semiconductor film is close to a true spherical shape, which results in a reduced number of sites at which stress is locally concentrated, and, consequently, the possibility of cracking is reduced.

The semiconductor film 14 has an average film thickness of greater than or equal to 10 μm. The average film thickness is preferably greater than or equal to 12 μm and more preferably greater than or equal to 14 μm. The upper limit of the average film thickness of the semiconductor film 14 is not particularly limited and is, for example, less than or equal to 1000 μm. The methods that may be used to measure the film thickness of the semiconductor film 14 are not particularly limited and include known methods. For example, the film thickness of the semiconductor film 14 can be measured with an ellipsometer (M-2000D, manufactured by JA Woollam Japan). The average film thickness of the semiconductor film 14 can be determined as follows: the film thickness of the semiconductor film 14 is measured at a total of 5 points, namely, points G, A, B, C, and D, illustrated in FIG. 2, and an average of the film thicknesses is calculated as the average film thickness of the semiconductor film 14.

An area of the film surface of the semiconductor film 14 is substantially equal to an area of the base substrate 12. The area of the film surface of the semiconductor film 14 is preferably greater than or equal to 20 cm², more preferably greater than or equal to 70 cm², and even more preferably greater than or equal to 170 cm². In the instance where the semiconductor film 14 has an increased area, it becomes possible to obtain a large number of semiconductor devices from a single semiconductor film 14, and, consequently, a cost of manufacture can be reduced. The upper limit of the size of the semiconductor film 14 is not particularly limited, and typically, the size of one side is less than or equal to 700 cm².

The semiconductor film 14 may include a Group 14 element, which serves as a dopant, in a ratio of 1.0×10¹⁶ to 1.0×10²¹/cm³. The Group 14 element is a Group 14 element according to the periodic table published by IUPAC (International Union of Pure and Applied Chemistry), and specifically, the Group 14 element is carbon (C), silicon (Si), germanium (Ge), tin (Sn), or lead (Pb). While the amount of the dopant may be appropriately changed in accordance with desired properties, the amount is preferably 1.0×10¹⁶ to 1.0×10²¹/cm³ and more preferably 1.0×10¹⁷ to 1.0×10¹⁹/cm³. It is preferable that the dopant be uniformly distributed in the film, and dopant concentrations of front and back surfaces of the semiconductor film 14 be approximately equal.

Furthermore, it is preferable that the semiconductor film 14 be a textured film having an orientation in a direction of a specific plane. The textural properties of the semiconductor film 14 can be examined with a known method. For example, the examination can be performed with inverse pole figure orientation mapping by using an electron back-scatter diffractometer (EBSD). For example, the semiconductor film may have a c-axis orientation or may have a c-axis orientation and an in-plane orientation.

[Method for Manufacturing Semiconductor Film]

A method for manufacturing the semiconductor film 14 includes (a) a step of producing the multilayer structure 10 and (b) a step of removing the semiconductor film 14 from the base substrate 12.

(a) Step of Producing Multilayer Structure 10

The multilayer structure 10 can be produced by depositing the semiconductor film 14 from an α-Ga₂O₃-based material on the base substrate 12. Regarding deposition methods, no particular limitations are imposed, and a known technique may be employed. Preferred deposition methods are mist CVD, HVPE, MBE, MOCVD, sputtering, and hydrothermal synthesis. Mist CVD and HVPE are particularly preferable.

The deposition method and deposition conditions for the multilayer structure 10 are not particularly limited as long as the amount of the convex warpage or the concave warpage of the semiconductor film 14 is within the appropriate range (20 μm or greater and 64 μm or less), and the average film thickness of the semiconductor film 14 is within the appropriate range (10 μm or greater). Furthermore, the amount of the convex warpage or the concave warpage of the semiconductor film 14 can be appropriately controlled with the deposition method, the deposition conditions, the film thickness, and/or the like.

An amount of convex warpage that exceeds a range that can be achieved depending on the deposition method, the deposition conditions, or the like can be achieved, for example, as follows: a base substrate 12 that is convexly warped is used, or a process that causes a base substrate 12 to be convexly warped during the deposition is performed. An exemplary method for preparing such a base substrate 12 is a method in which a material having a coefficient of thermal expansion greater than that of the base substrate 12 (high-thermal-expansion material) is provided, and the material is deposited on a back surface of the base substrate 12 at a predetermined temperature. In this instance, when the predetermined temperature at which the high-thermal-expansion material is deposited is reduced to room temperature, thermal stress occurs, which can impart convex warpage to the base substrate 12. Regarding an amount of warpage of the base substrate 12, it is possible to achieve a desired amount of warpage by controlling the coefficients of thermal expansion and thicknesses of the base substrate 12 and the high-thermal-expansion material. Regarding deposition methods for the high-thermal-expansion material, no particular limitations are imposed, and examples thereof include AD, HVPE, sputtering, vapor deposition, and CVD. HVPE, sputtering, and CVD are preferable. Alternatively, the high-thermal-expansion material may be bonded to the base substrate at a predetermined temperature instead of being deposited. Examples of methods for the bonding include, but are not limited to, methods using an adhesive and methods using sintering. It should be noted that, preferably, a protective layer may be formed on the surface of the base substrate 12 on which the semiconductor film 14 is to be formed, so that the high-thermal-expansion material cannot adhere to or be deposited onto the surface. Regarding the combination of the base substrate 12 and the high-thermal-expansion material, examples of the base substrate 12 include sapphire substrates and $Cr_2O_3$ single crystal substrates, and examples of the high-thermal-expansion material include transition metals, $MgAl_2O_4$, and MgO. Furthermore, the coefficient of thermal expansion of $Al_2O_3$ is greater along the c-axis than the a-axis, that is, the coefficient of thermal expansion of polycrystalline $Al_2O_3$ is greater than the coefficient of thermal expansion of the a-axis. Accordingly, in instances where c-plane sapphire is used as the base substrate 12, the high-thermal expansion material that may be used may be polycrystalline $Al_2O_3$.

Furthermore, in instances where a deposition method and/or a deposition condition results in an amount of convex warpage of the semiconductor film 14 that exceeds the appropriate range, a possible way to ensure that the amount of warpage falls within the appropriate range without replacing the deposition method and/or the deposition condition is, for example, to increase rigidity by using a thick base substrate 12 or to reduce the thickness of the semiconductor film 14 to the extent that the thickness does not fall below 10 μm. Alternatively, a base substrate 12 that is concavely warped may be used, or a process that causes a base substrate 12 to be concavely warped during the deposition may be performed. An exemplary method for preparing such a base substrate 12 is a method in which a material having a coefficient of thermal expansion less than that of the base substrate 12 (low-thermal-expansion material) is provided, and the material is deposited on a back surface of the base substrate 12 at a predetermined temperature. In this instance, when the predetermined temperature at which the low-thermal-expansion material is deposited is reduced to room temperature, thermal stress occurs, which can impart concave warpage to the base substrate 12. Regarding an amount of warpage of the base substrate 12, it is possible to achieve a desired amount of warpage by controlling the coefficients of thermal expansion and thicknesses of the base substrate 12 and the low-thermal-expansion material. Regarding deposition methods for the low-thermal-expansion material, no particular limitations are imposed, and examples thereof include AD, HVPE, sputtering, vapor deposition, and CVD. HVPE, sputtering, and CVD are preferable. Alternatively, the low-thermal-expansion material may be bonded to the base substrate at a predetermined temperature instead of being deposited. Examples of methods for the bonding include, but are not limited to, methods using an adhesive and methods using sintering. It should be noted that, preferably, a protective layer may be formed on the surface of the base substrate 12 on which the semiconductor film 14 is to be formed, so that the low-thermal-expansion material cannot adhere to or be deposited onto the surface. Regarding the combination of the base substrate 12 and the low-thermal-expansion material, examples of the base substrate 12 include sapphire substrates and $Cr_2O_3$ single crystal substrates, and examples of the low-thermal-expansion material include metals, such as AlN, SiC, W, and Mo.

Another method for reducing the amount of the convex warpage of the semiconductor film 14 is a method in which a damaged layer is formed on the back surface of the base substrate 12 to generate stress due to the Twyman effect, thereby reducing the amount of warpage. The damaged layer can be formed by using a known method, examples of which include grinding and blasting. Note that in some instances, the front surface or the back surface of the base substrate 12 may be ground, for example, for the purpose of adjusting a thickness or removing scratches or dirt, which may result in the formation of a damaged layer in the base substrate 12, and as a result, unintentional warpage may occur in the base substrate 12. In that instance, the formed damaged layer may be removed, for example, by performing mirror polishing, annealing at a predetermined temperature, or the like. In the instance where the damaged layer is removed by mirror polishing, the polishing may be performed on a region including the damaged layer and corresponding to a thickness greater than or equal to the thickness of the formed damaged layer, under conditions under which a damaged layer is unlikely to be introduced. For example, the removal of the damaged layer can be carried out as follows: grinding is performed with grinding stones up to a grit number of #6000, subsequently, lapping is performed with diamond abrasive grains, and subsequently, chemical mechanical polishing (CMP) is performed with colloidal silica.

An amount of concave warpage that exceeds a range that can be achieved depending on the deposition method, the deposition conditions, or the like can be achieved, for example, as follows: a base substrate 12 that is concavely warped is used, or a process that causes a base substrate 12 to be concavely warped during the deposition is performed. A method that may be employed for preparing such a base substrate 12 may be a method similar to the above-described method for preparing the base substrate 12 that is used for, in instances where a deposition method and/or a deposition condition results in an amount of convex warpage of the semiconductor film 14 that exceeds the appropriate range, ensuring that the amount of warpage falls within the appropriate range without replacing the deposition method and/or the deposition condition.

Another method for increasing the amount of concave warpage of the semiconductor film 14 is a method in which a damaged layer is formed on the back surface of the base substrate 12 to generate stress due to the Twyman effect, thereby increasing the amount of warpage. The damaged layer can be formed by using a known method, examples of which include grinding and blasting.

Furthermore, in instances where a deposition method and/or a deposition condition result in an amount of concave warpage of the semiconductor film 14 that exceeds the appropriate range, a possible way to ensure that the amount of warpage falls within the appropriate range without replacing the deposition method and/or the deposition condition is, for example, to increase rigidity by using a thick base substrate 12 or to increase the thickness of the semiconductor film 14. Alternatively, a base substrate 12 that is convexly warped may be used, or a process that causes a base substrate 12 to be convexly warped during the deposition may be performed. A method that may be employed for preparing such a base substrate 12 may be a method similar to the above-described method for preparing the base substrate 12 that is used for achieving an amount of convex warpage that exceeds a range that can be achieved depending on the deposition method, the deposition conditions, or the like.

Figure 7:
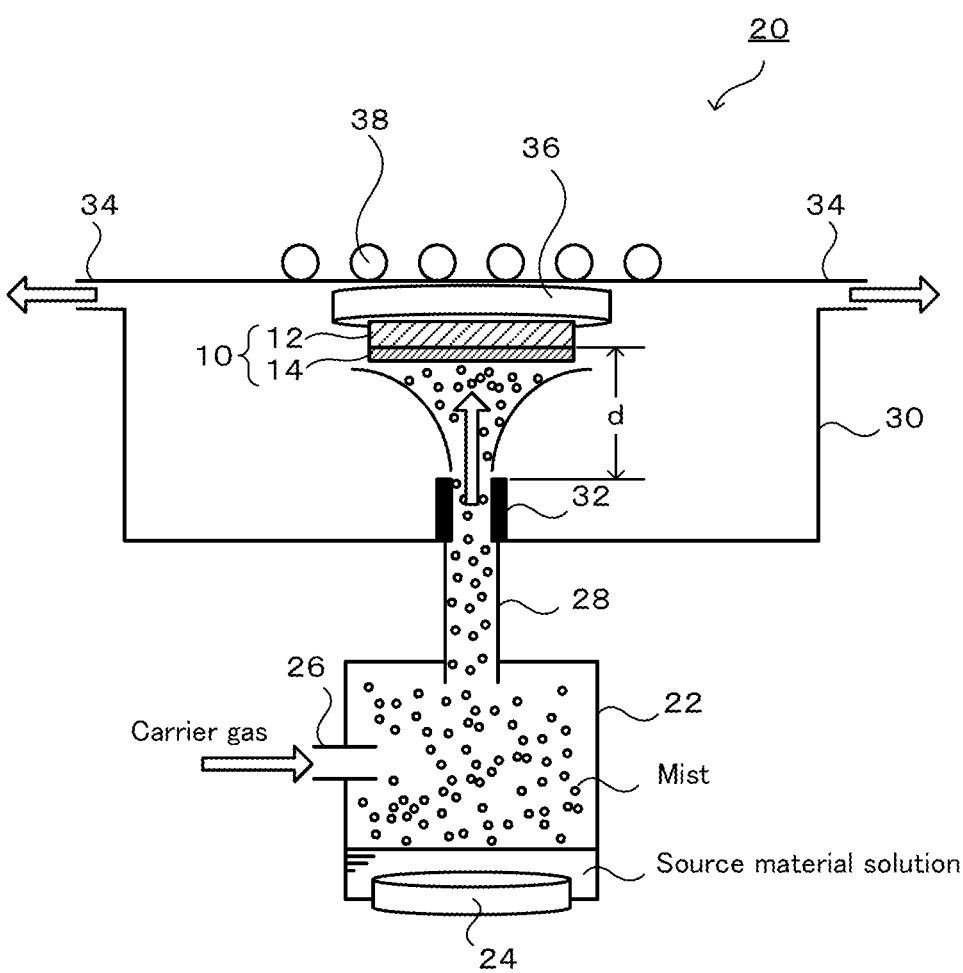
FIG. 7 is a schematic cross-sectional view of a configuration of a mist-CVD apparatus 20.

FIG. 7 is a schematic cross-sectional view of a configuration of a mist-CVD apparatus 20. The mist-CVD apparatus 20 includes a mist generator 22, a mist supply tube 28, and a growth chamber 30. The mist generator 22 generates mist by ultrasonicating a source material solution stored in the mist generator 22, upon actuation of an ultrasonic transducer 24, which is disposed on a bottom surface. A gas inlet port 26 is disposed on a side surface of the mist generator 22. A carrier gas can be introduced into the mist generator 22 from the outside through the gas inlet port 26. The mist supply tube 28 couples the mist generator 22 to the growth chamber 30. A lower end of the mist supply tube 28 extends through a top surface of the mist generator 22 to be in communication with the interior of the mist generator 22. An upper end of the mist supply tube 28 is in communication with a nozzle 32, which is attached to a bottom surface of the growth chamber 30. Accordingly, the mist generated in the mist generator 22 travels through the mist supply tube 28 to be supplied to the growth chamber 30. The growth chamber 30 is a cylindrical chamber. The growth chamber 30 includes a gas outlet port 34 in an upper portion of a side surface and includes a disc-shaped stage 36 on a top surface. The stage 36 can detachably hold the base substrate 12, which is used for crystal growth, on a lower surface. The growth chamber 30 includes, on the top surface, a heater 38, which is used to heat the base substrate 12 held on the stage 36.

An instance of preparing the multilayer structure 10 of the present embodiment with the mist-CVD apparatus 20 will be described. A gallium halide solution, which serves as the source material solution, is provided and added to the mist generator 22. A sapphire substrate, which is an $\alpha$-$Al_2O_3$ substrate and serves as the base substrate 12, is arranged to be detachably held on the lower surface of the stage 36. In this instance, a distance d (see FIG. 7), which is a distance from an upper end of the nozzle 32 to a lower surface of the base substrate 12, is set at an appropriate value (e.g., 100 mm or greater and 200 mm or less). Furthermore, the stage 36 is heated to a desired temperature with the heater 38. Thereafter, in the mist generator 22, the source material solution is atomized with the ultrasonic transducer 24 to generate mist. The mist generated in the mist generator 22 travels through the mist supply tube 28 together with a carrier gas (e.g., $N_2$ or a noble gas) introduced from the gas inlet port 26, to be supplied upwardly into the growth chamber 30 through the nozzle 32 disposed on the bottom surface of the growth chamber 30. Consequently, the gallium halide in the source material solution is thermally decomposed into gallium oxide, which is then heteroepitaxially grown on the lower surface of the base substrate 12 to form the semiconductor film 14 ($\alpha$-$Ga_2O_3$-based semiconductor film). The temperature of the stage 36 should be set such that the semiconductor film 14 can be formed and that the amounts $\alpha$ and $\beta$ of warpage of the formed semiconductor film 14 can fall within the range of 20 $\mu m$ or greater and 64 $\mu m$ or less. Specifically, the temperature is preferably 300° C. or greater and 800° C. or less and more preferably 400° C. or greater and 700° C. or less. The time for the growth should be set such that the average film thickness of the semiconductor film 14 becomes greater than or equal to 10 $\mu m$. In this manner, the multilayer structure 10 can be produced. Subsequently, a temperature of the multilayer structure 10 is reduced to room temperature (e.g., 10° C. or greater and 40° C. or less), and, consequently, the resulting multilayer structure 10 is one in which the amount of warpage and the average film thickness of the semiconductor film 14 fall within desired numerical ranges.

Figure 8:
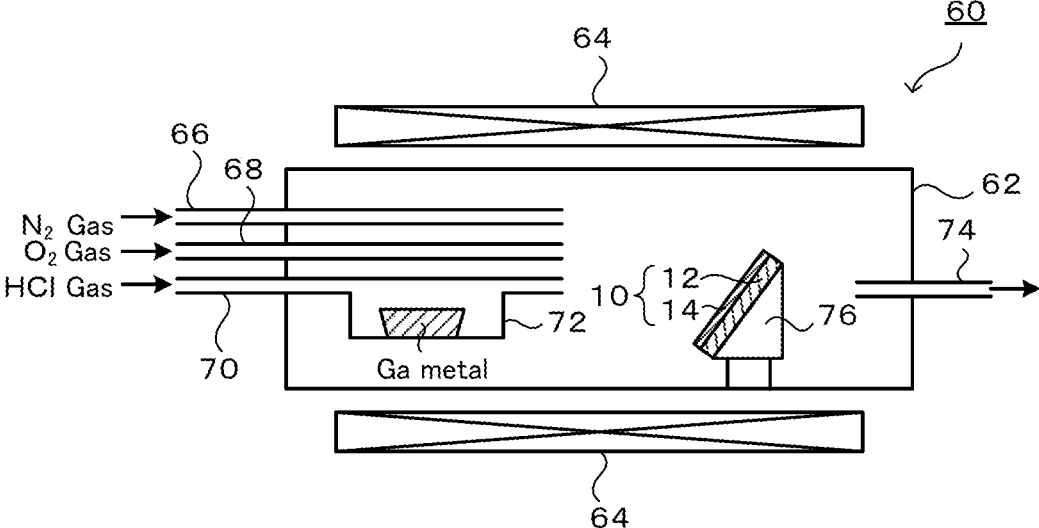
FIG. 8 is a schematic cross-sectional view of a configuration of a vapor deposition apparatus 60.

FIG. 8 is a schematic cross-sectional view of a configuration of a vapor deposition apparatus 60, which uses HVPE. The vapor deposition apparatus 60 includes a reaction vessel 62 and a heater 64.

The reaction vessel 62 is a vessel made of a material (e.g., quartz) that is non-reactive with various source materials and products. The reaction vessel 62 includes a carrier gas supply tube 66, an oxidizing gas supply tube 68, and a source material supply tube 70 attached to one of a pair of side surfaces that face each other and includes an exhaust tube 74 attached to the other of the side surfaces. The carrier gas supply tube 66 supplies a carrier gas (e.g., nitrogen or a noble gas) into the reaction vessel 62. The oxidizing gas supply tube 68 supplies an oxygen gas, which serves as an oxidizing gas, into the reaction vessel 62. One or more oxidizing gases other than oxygen may be supplied. Examples of the oxidizing gases include water vapor and nitrous oxide. In the source material supply tube 70, gallium halide is produced by a reaction between a halogen gas (e.g., a chlorine gas) or a hydrogen halide gas (e.g., a hydrogen chloride gas), which is supplied from a gas source, and gallium metal disposed in a storage portion 72, which is disposed at a position in the source material supply tube 70. Accordingly, the source material supply tube 70 supplies a gallium halide gas, which serves as a source material gas, into the reaction vessel 62. The halogen gas or the hydrogen halide gas may be supplied together with a carrier gas, such as nitrogen or a noble gas. A susceptor 76 is disposed downstream of the supply tubes 66, 68, and 70 in the reaction vessel 62. The susceptor 76 can detachably hold the base substrate 12. The exhaust tube 74 discharges unreacted gases from the reaction vessel 62. A vacuum pump may be connected to the exhaust tube 74, and the vacuum pump may be used to adjust the degree of vacuum within the reaction vessel 62. In this case, it is possible to inhibit a vapor phase reaction and improve a growth rate distribution.

The heater 64 is disposed to surround the reaction vessel 62. The heater 64 may be, for example, a resistive heater or the like.

An instance of preparing the multilayer structure 10 of the present embodiment with the vapor deposition apparatus 60 will be described. In the reaction vessel 62, an oxygen gas, which is supplied from the oxidizing gas supply tube 68, and a source material gas (a gallium halide gas), which is supplied from the source material supply tube 70, react with each other to form a semiconductor film 14 ($\alpha$-$Ga_2O_3$ film) on the base substrate 12. A temperature for the deposition should be set such that the semiconductor film 14 can be formed and that the amounts $\alpha$ and $\beta$ of warpage of the formed semiconductor film 14 can fall within the range of 20 $\mu m$ or greater and 64 $\mu m$ or less. Specifically, the temperature for the deposition is preferably 300° C. or greater and 800° C. or less and more preferably 400° C. or greater and 700° C. or less. Partial pressures of the oxygen gas and the source material gas are not particularly limited. For example, the partial pressure of the source material gas may be within a range of 0.05 kPa or greater and 10 kPa or less, and the partial pressure of the oxygen gas may be within a range of 0.25 kPa or greater and 50 kPa or less. The time for the growth should be set such that the average film thickness of the semiconductor film 14 becomes greater than or equal to 10 $\mu m$. In this manner, the multilayer structure 10 can be produced. Subsequently, a temperature of the multilayer structure 10 is reduced to room temperature (e.g., 10° C. or greater and 40° C. or less), and, consequently, the resulting multilayer structure 10 is one in which the amount of warpage and the average film thickness of the semiconductor film 14 fall within desired numerical ranges.

(b) Step of Removing Semiconductor Film 14 from Base Substrate 12

Methods that may be used to remove the semiconductor film 14 from the base substrate 12 of the thus-produced multilayer structure 10 having room temperature are not particularly limited and may include a known method. Examples of the removal methods include a method that performs removal by applying a mechanical impact, a method that performs removal by using a thermal stress by applying heat, and a method that performs removal by applying vibrations, such as those of ultrasonic waves. With the removal, the semiconductor film 14 can be obtained as a free-standing film. In addition, the semiconductor film 14 can be transferred to a different supporting substrate.

It is preferable that the semiconductor film 14 obtained as a free-standing film not have lost portions, and that the number of cracks per film area of 20 cm$^2$ in the film surface be less than or equal to 20. The number of cracks can be counted, for example, with an industrial microscope (Eclipse LV150N, manufactured by Nikon), although this is not a limitation. In this instance, the entirety of the film surface may be observed with a 10× ocular lens and a 5× objective lens in a polarization/differential interference mode, and in instances where a crack is found, the objective lens may be replaced with a 10× objective lens, and an image may be acquired. In the present embodiment, only cracks having a length of greater than or equal to 50 μm are counted as cracks. Furthermore, when a distance from one crack to another crack is less than or equal to 500 μm, the cracks are regarded together as a single crack. The number of cracks is counted for the entire film surface regardless of the size of the semiconductor film 14, and from the result, the number of cracks per film area of 20 cm$^2$ is calculated.

In the multilayer structure 10 of the present embodiment described above, the α-Ga$_2$O$_3$-based semiconductor film is one in which the occurrence of cracking and/or a removal failure during the manufacture is inhibited, and, therefore, the α-Ga$_2$O$_3$-based semiconductor film is one that can be manufactured in high yield. The mechanism for this is not clear and is assumed to be as follows: since the amount of warpage of the semiconductor film 14 is within the appropriate range (20 μm or greater and 64 μm or less), the semiconductor film 14 is placed into a state in which a proper stress is applied thereto, and, consequently, the semiconductor film 14 can be easily removed from the base substrate 12, and even if the film thickness is increased to as much as 10 μm or greater, the possibility of cracking is reduced. If the amount of warpage is less than the lower limit of the appropriate range, the stress applied to the semiconductor film 14 is insufficient, and as a result, it is possible that the semiconductor film 14 can only be partially removed from the base substrate 12, or cracking may occur if a stronger force is applied to remove the semiconductor film 14. If the amount of warpage is greater than the upper limit of the appropriate range, the stress applied to the semiconductor film 14 is excessively high, and as a result, cracking may occur in the semiconductor film 14 on the base substrate 12.

It goes without saying that the present invention is in no way limited to the embodiments described above and can be implemented in various embodiments as long as they belong to the technical scope of the present invention.

EXAMPLES

The present invention will be described in more detail with reference to examples below. Note that the present invention is in no way limited to the examples described below.

[Example 1] (Mist-CVD)

1. Production of Multilayer Structure
(1) Preparation of Source Material Solution Ga metal was added to hydrochloric acid, which was then stirred at room temperature for 4 weeks, and, accordingly, a gallium chloride having a gallium ion concentration of 3 mol/L was obtained. Water was added to the obtained gallium chloride solution, with an adjustment being made such that the aqueous solution had a gallium ion concentration of 65 mmol/L. Furthermore, ammonium hydroxide was added to adjust the pH to 4.0. In this manner, a source material solution was prepared.
(2) Arrangement for Deposition In a mist-CVD apparatus 20, which had the configuration illustrated in FIG. 7, the source material solution described above in (1) was stored in a mist generator 22. Next, a c-plane sapphire substrate (thickness: 0.43 mm) with a diameter of 2 inches (area: 20.3 cm$^2$), which was used as the base substrate 12, was loaded, and the distance d from the upper end of a nozzle 32 to the lower surface of the base substrate 12 was set to be 150 mm. A stage 36 was heated to a temperature of 520° C. by using a heater 38 and held 30 minutes to stabilize the temperature. Next, a flow control valve (not illustrated) provided at a gas inlet port 26 was opened to supply a carrier gas into the mist generator 22 and a growth chamber 30 to sufficiently replace the atmospheres of the mist generator 22 and the growth chamber 30 with the carrier gas. Subsequently, the flow rate of the carrier gas was adjusted to be 1.8 L/min. In this instance, the carrier gas used was a nitrogen gas.
(3) Deposition The source material solution was atomized with an ultrasonic transducer 24, and the generated mist was introduced into the growth chamber 30 with the carrier gas and reacted in the growth chamber 30. Accordingly, a circular semiconductor film 14 was formed on the lower surface of the base substrate 12, and a multilayer structure 10 was finally produced. A film surface of the semiconductor film 14 had an area equal to an area of the base substrate 12. The temperature for the deposition was 520° C., and the time for the deposition was 300 minutes. Subsequently, the temperature of the multilayer structure 10 was reduced to room temperature.
2. Evaluation of Film
(1) Surface EDX EDX spectroscopy was performed on the surface of the produced film, and the result was that only Ga and O were detected. This indicated that the produced semiconductor film 14 was made of a Ga oxide.
(2) EBSD EBSD analysis was performed on the semiconductor film 14. The obtained inverse pole figure orientation mapping suggested that the semiconductor film 14 had a biaxially textured corundum crystal structure with a c-axis orientation in a direction normal to the substrate and an in-plane orientation. This demonstrated the presence of a textured film, made of α-Ga$_2$O$_3$, that was formed.
(3) Measurement of Warpage The amount α of warpage, the amount β of warpage, the length of the line segment PO, and the length of the line segment RO of the semiconductor film 14 were measured with the method described in the "Description of Embodiments" section. The results are shown in Table 1. Table 1 also shows a small-to-large ratio of the amounts of warpage (a ratio of the smaller value to the larger value, of the amounts α and β of warpage).
(4) Film Thickness The average film thickness of the semiconductor film 14 was calculated with the method described in the "Description of Embodiments" section. Specifically, the measurement of the film thickness was performed with an ellipsometer (M-2000D, manufactured by JA Woollam Japan). The measurement positions were 5 points in total, namely, points G, A, B, C, and D, as illustrated in FIG. 2. The average film thickness was determined as an average of the film thicknesses measured at the 5 points. The results are shown in Table 1.

(5) Evaluations of Removal-related Yield, Crack-related Yield, and Total Yield

The semiconductor film 14 of the multilayer structure 10 was removed from the base substrate 12 by ultrasonication (frequency: 45 kHz). Semiconductor films that could be completely removed were identified as conforming products, and semiconductor films that could not be removed or could only be partially removed were identified as non-conforming products. A removal-related yield was calculated according to the following equation: Removal-related yield [%]=number of removal-related conforming products/ (number of removal-related conforming products+number of removal-related non-conforming products)×100. The results of the removal-related yields are shown in Table 1. Furthermore, regarding the removed semiconductor films 14 (only removal-related conforming products), a crack-related yield was evaluated by examining cracks with the method described in the "Description of Embodiments" section. Specifically, the entirety of the film surface was observed with an industrial microscope (Eclipse LV150N, manufactured by Nikon), with a 10× ocular lens and a 5× objective lens in a polarization/differential interference mode, and in instances where a crack was found, the objective lens was replaced with a 10× objective lens, and an image was acquired. Only cracks having a length of greater than or equal to 50 μm were counted as cracks. Furthermore, when a distance from one crack to another crack was less than or equal to 500 μm, the cracks were regarded together as a single crack. The number of cracks was counted for the entire film surface regardless of the size of the semiconductor film 14, and from the result, the number of cracks per film area of 20 cm² was calculated. Semiconductor films with a number of cracks per film area of 20 cm² of less than or equal to 20 were identified as conforming products, and the other semiconductor films were identified as non-conforming products. A crack-related yield was calculated according to the following equation: Crack-related yield [%]=number of crack-related conforming products/(number of crack-related conforming products+number of crack-related non-conforming products)×100. The results of the crack-related yields are shown in Table 1. Furthermore, a total yield was calculated according to the following equation: Total yield [%]=removal-related yield×crack-related yield/100. The result was 75%.

[Example 2] (Mist-CVD)

The base substrate 12 used was a convexly warped substrate, which was prepared by forming a polycrystalline $Al_2O_3$ layer on a back surface of a c-plane sapphire substrate with a diameter of 2 inches and then mirror-finishing the back surface. The method used to prepare the substrate is described below.

Figure 9:
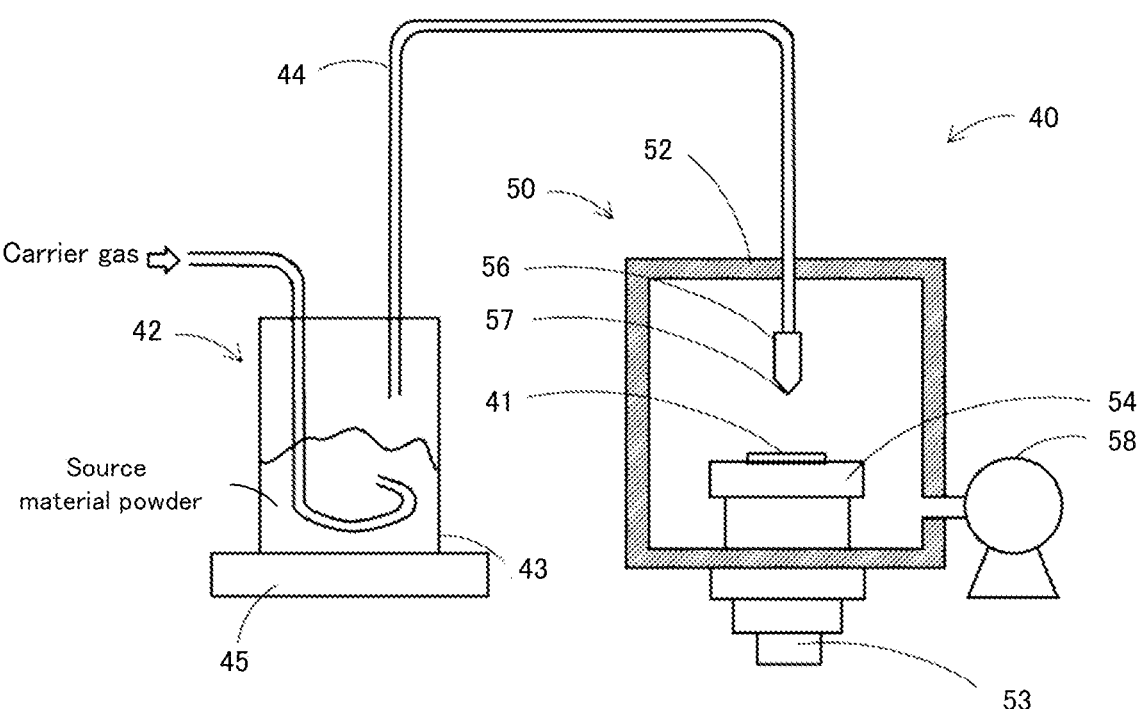
FIG. 9 is a schematic cross-sectional view of a configuration of an AD apparatus 40.
Figures 10A, 10B, 10C, 10D:
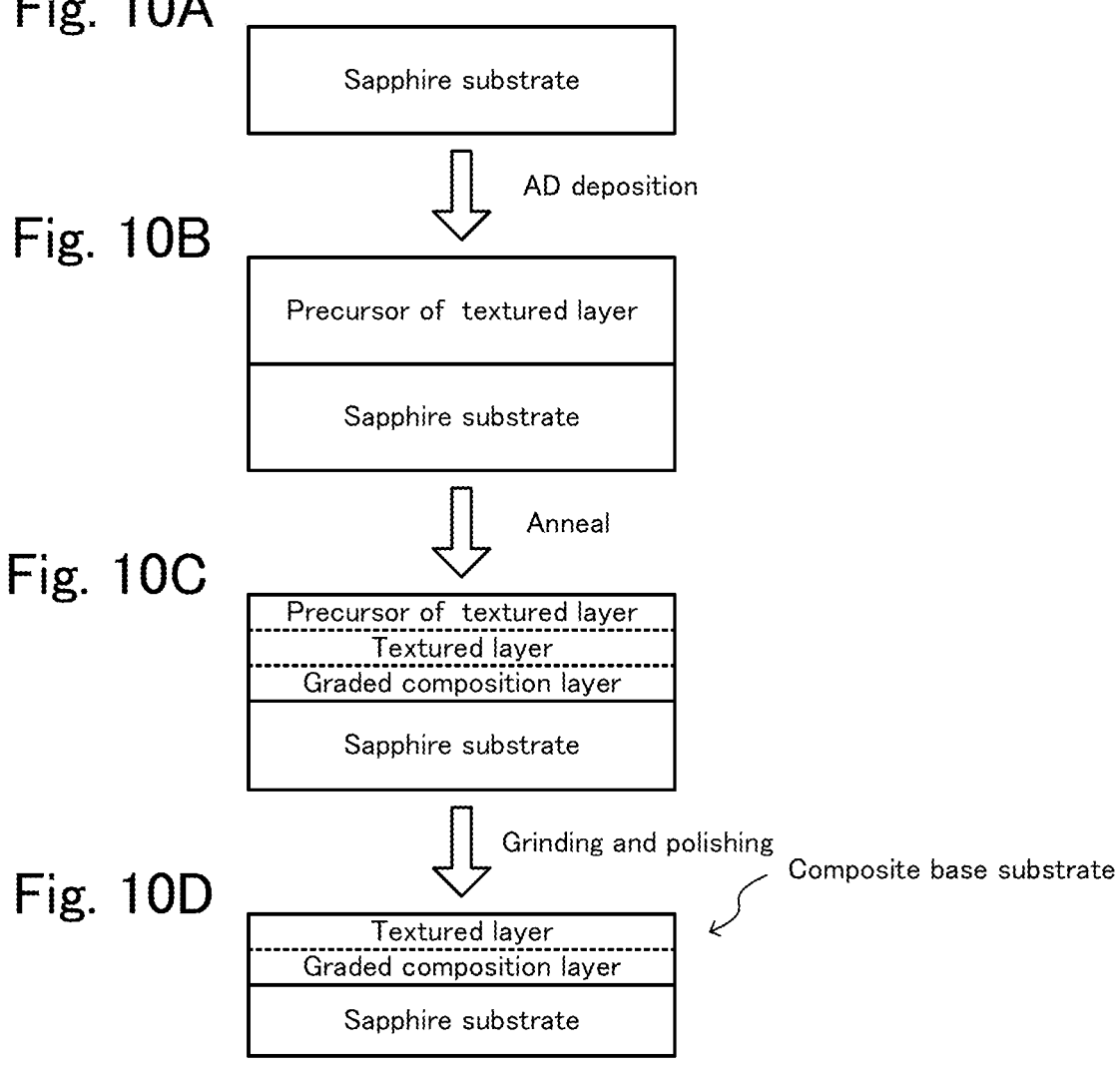
FIGS. 10A to 10D are flowcharts illustrating a process for preparing a composite base substrate.

An $Al_2O_3$ powder (AKP-20, manufactured by Sumitomo Chemical Company, Limited) was used as a source material powder, and sapphire (diameter: 50.8 mm (2 inches), thickness: 1.00 mm, c-plane, off angle: 0.2°) was used as the substrate. By using an aerosol deposition (AD) apparatus 40 as illustrated in FIG. 9, an AD film made of $Al_2O_3$ was formed on the seed substrate (sapphire substrate). The AD apparatus 40 illustrated in FIG. 9 is an apparatus configured to be used for an AD method in which a source material powder is sprayed onto a substrate in an atmosphere having a pressure lower than the atmospheric pressure. The AD apparatus 40 includes an aerosol generation unit 42 and a deposition unit 50. The aerosol generation unit 42 generates an aerosol of a source material powder that includes source material components. The deposition unit 50 is used to form a film that includes source material components, by spraying the source material powder onto the sapphire substrate 41. The aerosol generation unit 42 includes an aerosol generation chamber 43, a source material supply tube 44, and a vibrator 45. The aerosol generation chamber 43 stores a source material powder and generates an aerosol in response to a supply of a carrier gas from a gas cylinder (not illustrated). The source material supply tube 44 supplies the generated aerosol to the deposition unit 50. The vibrator 45 imparts vibrations to the aerosol generation chamber 43 and the aerosol therein at a frequency of 10 to 100 Hz. The deposition unit 50 includes a deposition chamber 52, a substrate holder 54, and an X-Y stage 53. The deposition chamber 52 sprays the aerosol onto the sapphire substrate 41. The substrate holder 54 is disposed within the deposition chamber 52 to secure the sapphire substrate 41 thereon. The X-Y stage 53 moves the substrate holder 54 in X-axis and Y-axis directions. The deposition unit 50 also includes a spray nozzle 56 and a vacuum pump 58. The spray nozzle 56 has a slit 57 in an end thereof and sprays the aerosol onto the sapphire substrate 41. The vacuum pump 58 reduces the pressure within the deposition chamber 52.

The AD deposition conditions were as follows. $N_2$ was used as the carrier gas, and a ceramic nozzle having a slit of 5 mm (long side)×0.3 mm (short side) was used. The conditions for the scanning of the nozzle were as follows. The scan speed was 0.5 mm/s. Scanning was repeatedly performed in which the nozzle was moved 55 mm in a direction that was perpendicular to the long side of the slit and was an advancing direction; the nozzle was then moved 5 mm in a direction of the long side of the slit; the nozzle was then moved 55 mm in a direction that was perpendicular to the long side of the slit and was a retracting direction; and the nozzle was then moved 5 mm in a direction of the long side of the slit and was opposite to the initial position. When the nozzle had moved to a position 55 mm from the initial position in the direction of the long side of the slit, scanning in directions reverse to the previous directions was performed to return the nozzle to the initial position. This cycle was regarded as one cycle, and the cycle was performed 400 times. In the one cycle of deposition at room temperature, a set pressure of the carrier gas was adjusted to 0.06 MPa, the flow rate thereof to 5 L/min, and a pressure within the chamber to 100 Pa or less. The thickness of the AD film formed in this manner was approximately 70 μm.

The sapphire substrate having the AD film formed thereon was removed from the AD apparatus and annealed in a nitrogen atmosphere at 1650° C. for 4 hours. In this manner, a polycrystalline $Al_2O_3$ layer was formed on the back surface of the sapphire substrate. The substrate prepared in this manner was secured to a ceramic plate, and the surface on the side on which the AD film was formed was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, the polycrystalline $Al_2O_3$ layer was mirror-finished by chemical mechanical polishing (CMP) with colloidal silica. The thickness of the polycrystalline $Al_2O_3$ layer after the mirror-finishing was 20 μm. Subsequently, the substrate was secured to a ceramic plate, and a surface of the sapphire substrate was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica. The thickness of the substrate after completion of the polishing was 0.80 mm.

In Example 2, the deposition and the evaluation were performed in a manner similar to that of Example 1, except that the base substrate 12 used was a convexly warped substrate, which was prepared as described above, and the time for the deposition was 450 minutes. The results are shown in Table 1. The EDX spectroscopy revealed that the semiconductor film 14 produced in Example 2 was also made of a Ga oxide, and the EBSD analysis revealed that the semiconductor film 14 was a textured film having a biaxially textured corundum crystal structure. Furthermore, the total yield was calculated as described above and found to be 93%.

[Example 3] (Mist-CVD)

The base substrate 12 used was a convexly warped substrate, which was prepared by forming a polycrystalline $Al_2O_3$ layer on a back surface of a c-plane sapphire substrate with a diameter of 2 inches and then grinding the back surface to introduce a damaged layer. The method used to prepare the substrate is described below.

An $Al_2O_3$ powder (AKP-20, manufactured by Sumitomo Chemical Company, Limited) was used as a source material powder, and sapphire (diameter: 50.8 mm (2 inches), thickness: 1.00 mm, c-plane, off angle: 0.2°) was used as the substrate. By using an AD apparatus 40 as illustrated in FIG. 9, an AD film made of $Al_2O_3$ was formed on the seed substrate (sapphire substrate). The AD deposition conditions were the same as those of Example 2.

The sapphire substrate having the AD film formed thereon was removed from the AD apparatus and annealed in a nitrogen atmosphere at 1650° C. for 4 hours. In this manner, a polycrystalline $Al_2O_3$ layer was formed on the back surface of the sapphire substrate. The substrate prepared in this manner was secured to a ceramic plate, and the surface on the side on which the AD film was formed was ground with grinding stones up to a grit number of #325 to introduce a damaged layer into the polycrystalline $Al_2O_3$ layer. The thickness of the polycrystalline $Al_2O_3$ layer after the #325 grinding was 20 Subsequently, the substrate was secured to a ceramic plate, and a surface of the sapphire substrate was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica. The thickness of the substrate after completion of the polishing was 0.45 mm.

In Example 3, the deposition and the evaluation were performed in a manner similar to that of Example 1, except that the base substrate 12 used was a convexly warped substrate, which was prepared as described above. The results are shown in Table 1. The EDX spectroscopy revealed that the semiconductor film 14 produced in Example 3 was also made of a Ga oxide, and the EBSD analysis revealed that the semiconductor film 14 was a textured film having a biaxially textured corundum crystal structure. Furthermore, the total yield was calculated as described above and found to be 85%.

[Example 4] (Mist-CVD)

Deposition and evaluation were performed in a manner similar to that of Example 1, except that the base substrate 12 used was a concavely warped substrate, which was prepared by grinding a back surface of a c-plane sapphire substrate with a diameter of 2 inches (thickness: 0.43 mm) up to a grit number of #325, thereby introducing a damaged layer. The results are shown in Table 1. The EDX spectroscopy revealed that the semiconductor film 14 produced in Example 4 was also made of a Ga oxide, and the EBSD analysis revealed that the semiconductor film 14 was a textured film having a biaxially textured corundum crystal structure. Furthermore, the total yield was calculated as described above and found to be 76%.

[Example 5] (Mist-CVD)

Deposition and evaluation were performed in a manner similar to that of Example 1, except that the base substrate 12 used was a concavely warped substrate, which was prepared by blasting a back surface of a c-plane sapphire substrate with a diameter of 2 inches (thickness: 0.43 mm) with an abrasive, namely, Fuji Rundum WA (particle size number: 100, manufactured by Fuji Manufacturing Co., Ltd.), thereby introducing a damaged layer. The results are shown in Table 1. The EDX spectroscopy revealed that the semiconductor film 14 produced in Example 5 was also made of a Ga oxide, and the EBSD analysis revealed that the semiconductor film 14 was a textured film having a biaxially textured corundum crystal structure. Furthermore, the total yield was calculated as described above and found to be 92%.

[Example 6] (Mist-CVD)

The base substrate 12 used was a concavely warped substrate, which was prepared by depositing AlN, by HVPE, on a back surface of a c-plane sapphire substrate with a diameter of 2 inches (thickness: 1.00 mm). The method used to prepare the substrate is described below.

The AlN film was deposited on the back surface of the sapphire substrate by HVPE at 1200° C. to a thickness of 5 μm. After the deposition of AlN, the substrate was secured to a ceramic plate, and a surface of the sapphire substrate was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica. The thickness of the substrate after completion of the polishing was 0.435 mm.

In Example 6, the deposition and the evaluation were performed in a manner similar to that of Example 1, except that the base substrate 12 used was a concavely warped substrate, which was prepared as described above. The results are shown in Table 1. The EDX spectroscopy revealed that the semiconductor film 14 produced in Example 6 was also made of a Ga oxide, and the EBSD analysis revealed that the semiconductor film 14 was a textured film having a biaxially textured corundum crystal structure. Furthermore, the total yield was calculated as described above and found to be 85%.

[Example 7] (Mist-CVD)

The base substrate 12 used was a composite base substrate with a diameter of 2 inches. The method used to prepare the composite base substrate is described below.
(1) Preparation of Composite Base Substrate A $Cr_2O_3$ powder (Colortherm Green, manufactured by Lanxess) was used as a source material powder, and sapphire (diameter: 50.8 mm (2 inches), thickness: 2.00 mm, c-plane, off angle: 0.2°) was used as the substrate. By using an AD apparatus 40 as illustrated in FIG. 9, an AD film (a precursor of a textured layer) made of $Cr_2O_3$ was formed on the seed substrate (sapphire substrate).

The AD deposition conditions were as follows. $N_2$ was used as the carrier gas, and a ceramic nozzle having a slit of 5 mm (long side)×0.3 mm (short side) was used. The conditions for the scanning of the nozzle were as follows. The scan speed was 0.5 mm/s. Scanning was repeatedly performed in which the nozzle was moved 55 mm in a direction that was perpendicular to the long side of the slit and was an advancing direction; the nozzle was then moved 5 mm in a direction of the long side of the slit; the nozzle was then moved 55 mm in a direction that was perpendicular to the long side of the slit and was a retracting direction; and the nozzle was then moved 5 mm in a direction of the long side of the slit and was opposite to the initial position. When the nozzle had moved to a position 55 mm from the initial position in the direction of the long side of the slit, scanning in directions reverse to the previous directions was performed to return the nozzle to the initial position. This cycle was regarded as one cycle, and the cycle was performed 500 times. In the one cycle of deposition at room temperature, a set pressure of the carrier gas was adjusted to 0.06 MPa, the flow rate thereof to 6 L/min, and a pressure within the chamber to 100 Pa or less. The thickness of the AD film formed in this manner was approximately 100 μm.

The sapphire substrate having the AD film formed thereon was removed from the AD apparatus and annealed in a nitrogen atmosphere at 1700° C. for 4 hours. The substrate prepared in this manner was secured to a ceramic plate, and the surface on the side on which the AD film was formed was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica, and, accordingly, a composite base substrate was prepared. An arithmetic mean roughness Ra after the processing was 0.1 nm, and an amount of grinding and polishing was 50 μm. The thickness of the substrate after completion of the polishing was 2.05 mm. Note that the surface on the side on which the AD film was formed is referred to as a "front surface".
(2) Evaluation of Textured Layer
(2a) Cross-Sectional EDX Composition analysis was performed on a cross section orthogonal to a major surface of the substrate with an energy dispersive X-ray spectrometer (EDX). The result was that only Cr and O were detected in a region extending to a depth of approximately 20 μm from the front surface of the composite base substrate. A ratio between Cr and O was substantially uniform over the region extending approximately 20 μm, which indicated the presence of a Cr oxide layer having a thickness of approximately 20 μm that was formed. Furthermore, Cr, O, and Al were detected in a region extending to a depth of 30 μm from the Cr oxide layer, which indicated the presence of a Cr—Al oxide layer (a graded composition layer) of approximately 30 μm formed between the Cr oxide layer and the sapphire substrate. A ratio between Cr and Al varied in the Cr—Al oxide layer, and it was observed that a region close to the sapphire substrate had a high Al concentration, and a region close to the Cr oxide layer had a low Al concentration.
(2b) Surface EBSD Inverse pole figure orientation mapping was performed on the front surface of the substrate formed of the Cr oxide layer, with an SEM (SU-5000, manufactured by Hitachi High-Technologies Corporation) equipped with an electron backscatter diffractometer (EBSD) (Nordlys Nano, manufactured by Oxford Instruments), with a field of view of 500 μm×500 μm. The conditions for the EBSD measurement were as follows.
<EBSD Measurement Conditions>
    Acceleration voltage: 15 kV
    Spot intensity: 70
    Working Distance: 22.5 mm
    Step size: 0.5 μm
    Tilt angle of sample: 70°
    Measurement program: Aztec (version 3.3)

The obtained inverse pole figure orientation mapping suggested that the Cr oxide layer was a layer having a biaxially textured corundum crystal structure with a c-axis orientation in a direction normal to the substrate and an in-plane orientation. This demonstrated that the front surface of the substrate included a textured film, made of $\alpha$-$Cr_2O_3$, that was formed. Based on what has been described, a schematic illustration of the steps of preparing the composite base substrate is as presented in FIGS. 10A to 10D.
(2c) XRD An XRD in-plane measurement was performed on the front surface of the substrate with a multifunctional high-resolution X-ray diffractometer (D8 Discover, manufactured by Bruker AXS Inc.). Specifically, the Z axis was adjusted in accordance with a height of the front surface of the substrate, subsequently, the setting of axes was carried out with the adjustment of Chi, Phi, ω, and 2θ with respect to the (11-20) plane, and thereafter, a 2θ-ω measurement was performed under the following conditions.
<XRD Measurement Conditions>
    Tube voltage: 40 kV
    Tube current: 40 mA
    Detector: Triple Ge (220) analyzer
    CuKα radiation that was collimated and monochromated
      (full width at half maximum: 28 seconds) with a Ge
      (022) asymmetric reflection monochromator
    Step size: 0.001°
    Scan speed: 1.0 second/step The result was that the textured layer was found to have an a-axis length of 4.961 Å.

In Example 7, the deposition and the evaluation were performed in a manner similar to that of Example 1, except that the deposition was performed on an $\alpha$-$Cr_2O_3$ textured layer of a composite base substrate, which was prepared as described above, and the time for the deposition was 450 minutes. The results are shown in Table 1. The EDX spectroscopy revealed that the semiconductor film 14 produced in Example 7 was also made of a Ga oxide, and the EBSD analysis revealed that the semiconductor film 14 was a textured film having a biaxially textured corundum crystal structure. Furthermore, the total yield was calculated as described above and found to be 94%.

[Example 8] (HVPE)

A convexly warped substrate was prepared as the base substrate 12 in a manner similar to that of Example 2 and provided in a vapor deposition apparatus 60, illustrated in FIG. 8. A hydrogen chloride gas was introduced into a source material supply tube 70 to cause Ga metal and the hydrogen chloride gas to react with each other in the source material supply tube 70, thereby producing a gallium chloride gas. The gallium chloride gas was supplied into a reaction vessel 62 from the source material supply tube 70. The oxidizing gas used was an oxygen gas, and the carrier gas used was a $N_2$ gas. The temperature for the growth was 550° C., and the time for the deposition was 80 minutes. In this manner, a multilayer structure 10 in which a semiconductor film 14 was formed on the base substrate 12 was produced. The subsequent evaluations were performed in a manner similar to that of Example 1. The results are shown in Table 1. The EDX spectroscopy revealed that the semiconductor film 14 produced in Example 8 was also made of a Ga oxide, and the EBSD analysis revealed that the semiconductor film 14 was a textured film having a biaxially textured corundum crystal structure. Furthermore, the total yield was calculated as described above and found to be 93%.

[Comparative Example 1] (Mist-CVD)

Deposition and evaluation were performed in a manner similar to that of Example 1, except that the time for the deposition was 240 minutes. The results are shown in Table 1. The EDX spectroscopy revealed that the semiconductor film 14 obtained in Comparative Example 1 was also made of a Ga oxide, and the EBSD analysis revealed that the semiconductor film 14 was a textured film having a biaxially textured corundum crystal structure. The total yield of Comparative Example 1 was calculated as described above and found to be 59%, which was lower than the total yield of Example 1.

[Comparative Example 2] (Mist-CVD)

The base substrate 12 used was a convexly warped substrate, which was prepared by forming a polycrystalline $Al_2O_3$ layer on a back surface of a c-plane sapphire substrate with a diameter of 2 inches and then mirror-finishing the back surface. The method used to prepare the substrate is described below.

An $Al_2O_3$ powder (AKP-20, manufactured by Sumitomo Chemical Company, Limited) was used as a source material powder, and sapphire (diameter: 50.8 mm (2 inches), thickness: 1.00 mm, c-plane, off angle: 0.2°) was used as the substrate. By using an AD apparatus 40 as illustrated in FIG. 9, an AD film made of $Al_2O_3$ was formed on the seed substrate (sapphire substrate). The AD deposition conditions were the same as those of Example 2.

The sapphire substrate having the AD film formed thereon was removed from the AD apparatus and annealed in a nitrogen atmosphere at 1650° C. for 4 hours. In this manner, a polycrystalline $Al_2O_3$ layer was formed on the back surface of the sapphire substrate. The substrate prepared in this manner was secured to a ceramic plate, and the surface on the side on which the AD film was formed was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, the polycrystalline $Al_2O_3$ layer was mirror-finished by chemical mechanical polishing (CMP) with colloidal silica. The thickness of the polycrystalline $Al_2O_3$ layer after the mirror-finishing was 20 μm. Subsequently, the substrate was secured to a ceramic plate, and a surface of the sapphire substrate was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica. The thickness of the substrate after completion of the polishing was 0.45 mm.

In Comparative Example 2, the deposition and the evaluation were performed in a manner similar to that of Example 1, except that the base substrate 12 used was a convexly warped substrate, which was prepared as described above. The results are shown in Table 1. The EDX spectroscopy revealed that the semiconductor film 14 produced in Comparative Example 2 was also made of a Ga oxide, and the EBSD analysis revealed that the semiconductor film 14 was a textured film having a biaxially textured corundum crystal structure. The total yield of Comparative Example 2 was calculated as described above and found to be 58%, which was lower than the total yield of Example 1.

[Comparative Example 3] (Mist-CVD)

Deposition and evaluation were performed in a manner similar to that of Example 1, except that the base substrate 12 used was a concavely warped substrate, and the time for the deposition was 360 minutes; the concavely warped substrate was prepared by grinding a back surface of a c-plane sapphire substrate with a diameter of 2 inches (thickness: 0.43 mm) up to a grit number of #325, thereby introducing a damaged layer. The results are shown in Table 1. The EDX spectroscopy revealed that the semiconductor film 14 produced in Comparative Example 3 was also made of a Ga oxide, and the EBSD analysis revealed that the semiconductor film 14 was a textured film having a biaxially textured corundum crystal structure. The total yield of Comparative Example 3 was calculated as described above and found to be 58%, which was lower than the total yield of Example 1.

[Comparative Example 4] (Mist-CVD)

Deposition and evaluation were performed in a manner similar to that of Example 1, except that the base substrate 12 used was a concavely warped substrate, which was prepared by depositing AlN, by HVPE, on a back surface of a c-plane sapphire substrate with a diameter of 2 inches (thickness: 1.00 mm) and subsequently performing grinding, thereby introducing a damaged layer into the AlN film. The method used to prepare the substrate is described below.

The AlN film was deposited on the back surface of the sapphire substrate by HVPE at 1200° C. After the deposition of AlN, the substrate was secured to a ceramic plate, and the surface on which the AlN film was deposited was ground with grinding stones up to a grit number of #325 to introduce a damaged layer. The film thickness of the AlN after the grinding was 5 μm. Subsequently, the surface of the sapphire substrate was ground with grinding stones up to a grit number of #6000 to planarize the surface of the substrate. Subsequently, lapping was performed with diamond abrasive grains to smooth the surface of the substrate. The size of the abrasive grains was reduced stepwise from 3 μm to 0.5 μm to increase planarity. Subsequently, mirror-finishing was performed by chemical mechanical polishing (CMP) with colloidal silica. The thickness of the substrate after the mirror-finishing was 0.435 mm.

In Comparative Example 4, the deposition and the evaluation were performed in a manner similar to that of Example 1, except that the base substrate 12 used was a concavely warped substrate, which was prepared as described above. The results are shown in Table 1. The EDX spectroscopy revealed that the semiconductor film 14 produced in Comparative Example 4 was also made of a Ga oxide, and the EBSD analysis revealed that the semiconductor film 14 was a textured film having a biaxially textured corundum crystal structure. The total yield of Comparative Example 4 was calculated as described above and found to be 59%, which was lower than the total yield of Example 1.

2. The multilayer structure according to claim 1, wherein the amount of warpage of the semiconductor film is defined by an amount α of warpage and by an amount β of warpage, in an instance in which, in a plan-view illustration of the semiconductor film as viewed in plan, a straight line X and a straight line Y are defined as two straight lines passing a point G and being orthogonal to each other, the point G being a center of gravity in the plan-view illustration; a point A and a point B are defined as two points each positioned on the straight line X and 20 mm away from the point G, and a point C and a point D are defined as two points each positioned on the straight line Y and 20 mm away from the point G; a point P is defined as a point from which a distance to a line segment AB is a maximum, among points on a curved line AB, which is a curved line extending on a surface of the semiconductor film from the point A to the point B, and a point R is defined as a point from which a distance to a line segment CD is a maximum, among points on a curved line CD, which is a curved line extending on the surface of the semiconductor film from the point C to the

TABLE 1

| | Shape of warpage | Amount of warpage | | Small-to- large ratio (%) | Length of line segment | | Film thickness (um) | Yield | | |
|---|---|---|---|---|---|---|---|---|---|---|
| | | α (μm) | β (μm) | | PO (mm) | RO (mm) | | Removal (%) | Crack (%) | Total (%) |
| Example 1 | Convex | 21.0 | 20.8 | 99.0 | 1 | 2 | 10.2 | 77 | 98 | 75 |
| Example 2 | Convex | 30.8 | 31.1 | 99.0 | 0 | 2 | 15.2 | 97 | 96 | 93 |
| Example 3 | Convex | 63.9 | 63.6 | 99.5 | 3 | 0 | 10.3 | 99 | 86 | 85 |
| Example 4 | Concave | 20.5 | 21.3 | 96.2 | 2 | 1 | 10.6 | 77 | 99 | 76 |
| Example 5 | Concave | 30.8 | 30.1 | 97.7 | 2 | 0 | 10.7 | 97 | 95 | 92 |
| Example 6 | Concave | 63.6 | 63.8 | 99.7 | 1 | 3 | 10.5 | 99 | 86 | 85 |
| Example 7 | Convex | 31.4 | 30.4 | 96.8 | 0 | 1 | 15.4 | 99 | 95 | 94 |
| Example 8 | Convex | 30.4 | 30.9 | 98.4 | 3 | 1 | 14.3 | 98 | 95 | 93 |
| Comparative Example 1 | Convex | 17.8 | 17.3 | 97.2 | 1 | 1 | 8.6 | 60 | 99 | 59 |
| Comparative Example 2 | Convex | 72.9 | 73.6 | 99.0 | 2 | 3 | 10.3 | 99 | 59 | 58 |
| Comparative Example 3 | Concave | 16.9 | 17.2 | 98.3 | 2 | 1 | 12.5 | 59 | 99 | 58 |
| Comparative Example 4 | Concave | 69.7 | 69.2 | 99.3 | 2 | 3 | 10.7 | 99 | 60 | 59 |

The present application claims priority from Japanese Patent Application No. 2020-159611, which was filed on Sep. 24, 2020, the entire contents of which are incorporated herein by reference. International Application No. PCT/JP2021/021939, filed on Jun. 9, 2021, is incorporated herein by reference in its entirety.

What is claimed is:

1. A multilayer structure comprising:
a base substrate; and
a semiconductor film made of α-Ga₂O₃ or an α-Ga₂O₃-based solid solution and having a corundum crystal structure, the semiconductor film being disposed on the base substrate, wherein
the semiconductor film has an average film thickness of greater than or equal to 10 μm,
the semiconductor film is convexly or concavely warped, and
an amount of warpage of the semiconductor film is 20 μm or greater and 64 μm or less.

point D; and the amount α of warpage is defined as the distance from the point P to the line segment AB, and the amount β of warpage is defined as the distance from the point R to the line segment CD.

3. The multilayer structure according to claim 2, wherein in an instance in which a point O is defined as a point positioned on the surface of the semiconductor film and corresponding to the point G, a length of a line segment PO is less than or equal to 10 mm, and a length of a line segment RO is less than or equal to 10 mm.

4. The multilayer structure according to claim 2, wherein a value of the smaller of the amount α of warpage and the amount β of warpage is 50% or greater and 100% or less of a value of the larger of the amount α of warpage and the amount β of warpage.

5. The multilayer structure according to claim 1, wherein the amount of warpage of the semiconductor film is 30 μm or greater and 64 μm or less.

* * * * *